United States Patent
Youn et al.

(10) Patent No.: US 9,147,461 B1
(45) Date of Patent: Sep. 29, 2015

(54) SEMICONDUCTOR MEMORY DEVICE PERFORMING A REFRESH OPERATION, AND MEMORY SYSTEM INCLUDING THE SAME

(71) Applicant: Samsung Electronics Co., Ltd., Suwon-si (KR)

(72) Inventors: Jae-Youn Youn, Seoul (KR); So-Young Kim, Hwaseong-si (KR); Kwang-Sook Noh, Hwaseong-si (KR); Sang-Jae Rhee, Seongnam-si (KR); Hyun-Chul Yoon, Yongin-si (KR); Yoon-Jae Lee, Seoul (KR); Jung-Bae Lee, Seongnam-si (KR); Joo-Sun Choi, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/185,264

(22) Filed: Feb. 20, 2014

Related U.S. Application Data

(63) Continuation of application No. 14/089,849, filed on Nov. 26, 2013, now abandoned.

(60) Provisional application No. 61/730,637, filed on Nov. 28, 2012.

(51) Int. Cl.
| | | |
|---|---|---|
| *G11C 11/40* | (2006.01) | |
| *G11C 11/406* | (2006.01) | |
| *G11C 8/18* | (2006.01) | |
| *G06F 11/10* | (2006.01) | |
| *G11C 11/22* | (2006.01) | |

(52) U.S. Cl.
CPC ............ *G11C 11/40626* (2013.01); *G11C 8/18* (2013.01); *G06F 11/106* (2013.01); *G11C 11/22* (2013.01)

(58) Field of Classification Search
CPC .................. G11C 11/40618; G11C 11/40611; G11C 2211/4067; G11C 11/40626; G11C 11/22; G11C 8/18; G06F 11/106
USPC .............. 365/222, 230.03; 711/106; 257/295; 714/764
See application file for complete search history.

(56) References Cited

U.S. PATENT DOCUMENTS

| | | | |
|---|---|---|---|
| 5,583,818 A | 12/1996 | You et al. | |
| 6,327,210 B1 | 12/2001 | Kuroda et al. | |
| 7,149,644 B2 | 12/2006 | Kobayashi et al. | |
| 7,583,553 B2 * | 9/2009 | Mori | |
| 2004/0221098 A1 * | 11/2004 | Ito et al. | 711/106 |
| 2005/0169091 A1 * | 8/2005 | Miki et al. | 365/230.03 |
| 2005/0281112 A1 * | 12/2005 | Ito et al. | 365/222 |
| 2005/0286330 A1 * | 12/2005 | Ito et al. | 365/222 |
| 2007/0171750 A1 * | 7/2007 | Oh | 365/222 |
| 2008/0023741 A1 * | 1/2008 | Kang | 257/295 |

(Continued)

*Primary Examiner* — Richard Elms
*Assistant Examiner* — Ajay Ojha
(74) *Attorney, Agent, or Firm* — Muir Patent Law, PLLC

(57) ABSTRACT

A semiconductor memory device includes a memory cell array and a refresh control circuit. The refresh circuit is configured to: perform a second burst refresh operation on the memory cell rows after the memory cell rows exit from a self refresh operation, and not perform the second burst refresh operation on the memory cell rows after the memory cell rows exit from a self refresh operation. Whether the refresh control circuit performs or does not perform the second burst refresh operation is based on a comparison between an entering time for the self refresh operation of the memory cell rows and a reference time.

13 Claims, 16 Drawing Sheets

(56) References Cited

U.S. PATENT DOCUMENTS

2009/0235145 A1* 9/2009 Ito et al. .................. 714/764
2010/0124138 A1   5/2010 Lee et al.
2011/0299352 A1   12/2011 Fujishiro et al.

* cited by examiner

SEMICONDUCTOR MEMORY DEVICE PERFORMING A REFRESH OPERATION, AND MEMORY SYSTEM INCLUDING THE SAME

CROSS-REFERENCE TO RELATED APPLICATION(S)

This U.S. non-provisional application is a continuation of and claims priority to U.S. application Ser. No. 14/089,849, filed Nov. 26, 2013, which claims the benefit of priority under 35 USC §119 to U.S. Provisional Application No. 61/730,637 filed on Nov. 28, 2012 in the USPTO, the contents of both applications being herein incorporated by reference in their entirety.

BACKGROUND

1. Technical Field

This disclosure relates to memory devices, and more particularly to a semiconductor memory device and a memory system including the same.

2. Discussion of the Related Art

The refresh operation of memory cells should be continuously performed even in a stand-by mode so as to retain data stored in the memory cell, e.g., that of a Dynamic Random Access Memory (DRAM) device. A self-refresh mode is widely used for DRAMs. The self-refresh mode is of the type adapted to perform the refresh operation of the memory cell with the lapse of a predetermined time after going into an operation stand-by mode, even though a separate control signal is not applied from an external source to the memory device. Once the self-refresh mode starts, it is preferable to perform the refresh operation of all memory cells in order to keep data. Thus, the memory devices employing the self-refresh mode have their own refresh regulation time (i.e. the minimum time required in performing the self-refresh mode).

SUMMARY

Some example embodiments provide a semiconductor memory device capable of reducing current consumed in a self-refresh operation.

Some example embodiments provide a memory system including the semiconductor memory device, and a method of operating the semiconductor memory device.

In one embodiment, a semiconductor memory device includes a memory cell array including a plurality of memory cell rows, and a refresh control circuit. The refresh circuit is configured to: perform a second burst refresh operation on the memory cell rows after the memory cell rows exit from a self refresh operation, and not perform the second burst refresh operation on the memory cell rows after the memory cell rows exit from a self refresh operation. Whether the refresh control circuit performs or does not perform the second burst refresh operation is based on a comparison between an entering time for the self refresh operation of the memory cell rows and a reference time.

In one embodiment, the refresh control circuit is configured to perform the second burst refresh operation on the memory cell rows after the memory cell rows exit from the self refresh operation when the entering time for the self refresh operation is greater than the reference time.

In one embodiment, the refresh control circuit is configured to not perform the second burst refresh operation on the memory cell rows after the memory cell rows exit from the self refresh operation when the entering time for the self refresh operation is less than the reference time.

In one embodiment, the refresh control circuit is configured to perform the second burst refresh operation with a second refresh interval shorter than a first refresh interval defined by a specification.

In one embodiment, the refresh control circuit is configured to perform a first burst refresh operation on the memory cell rows when the memory cell rows enter into the self refresh operation.

The refresh control circuit may perform the self refresh operation on the memory cell rows with a second refresh interval longer than a first refresh interval defined by a specification during the entering time after the refresh control circuit performs the first burst refresh operation on the memory cell rows.

The reference time may correspond to a time required for performing a burst refresh operation on the memory cell rows.

In one embodiment, the refresh control circuit comprises: a self-refresh mode detector configured to generate a self-refresh starting signal indicating time which a self refresh mode operation initiates, in response to a control signal; a burst refresh mode controller configured to generate a burst refresh control signal in response to the self-refresh starting signal, the burst refresh control signal directing the second burst refresh operation; a retention signal generator configured to receive the self-refresh starting signal and configured to compare an activation interval of the self-refresh starting signal and the reference time to generate a retention signal; a first pulse generator configured to generate a first pulse signal toggling with a first period, in response to the burst refresh control signal; a self-refresh mode controller configured to generate a self-refresh control signal in response to the burst refresh control signal and the self-refresh starting signal; a second pulse generator configured to generate a second pulse signal toggling with a second period longer than the first period, in response to the self-refresh control signal and the retention signal; and a refresh pulse output circuit configured to output an activated one of the first and second pulse signals as a refresh pulse signal.

The retention signal generator may be configured to activate the retention signal when the activation interval of the self-refresh starting signal is greater than the reference time.

The refresh control circuit may further include a counter configured to count toggling of the first pulse signal to generate a blocking pulse that disables the burst refresh controller, and the burst refresh control signal is deactivated in response to a rising edge of the retention signal.

The second pulse generator may be configured to increase a period of the second pulse in response to a rising edge of the retention signal.

The refresh control circuit may further include a refresh counter configured to generate a refresh row address increasing gradually, in response to the refresh pulse signal.

In one embodiment, the semiconductor memory device further includes: a temperature sensor configured to sense an operating temperature of the semiconductor memory device and to generate an operation mode signal based on the sensed operating temperature, wherein the refresh control circuit is configured to alter a self refresh interval of the self-refresh operation in further response to the operation mode signal.

The refresh control circuit may be configured to perform the second burst refresh operation in response to control signals from a memory controller.

The refresh control circuit may be configured to perform the second burst refresh operation internally in the semiconductor memory device.

In one embodiment, a semiconductor memory device includes: a memory cell array including a plurality of memory cell rows; and a refresh control circuit. The refresh control circuit is configured to cause the semiconductor memory device to: perform a first refresh operation on the memory cell rows based on a first signal toggling at a first period; after performing the first refresh operation, perform a second refresh operation on the memory cell rows based on a second signal toggling at a second period shorter than the first period, and after performing the first refresh operation, not perform the second refresh operation on the memory cell rows. Whether the refresh control circuit performs or does not perform the second refresh operation is based on a comparison between a reference time and an active period of a signal that initiates a refresh operation that includes the first refresh operation.

In one embodiment, when the second refresh operation is performed on the memory cell rows, the second refresh operation occurs immediately after the end of the first refresh operation; and when the second refresh operation is not performed on the memory cell rows, the second refresh operation does not occur immediately after the end of the first refresh operation.

In one embodiment, the refresh control circuit performs the first refresh operation on the memory cell rows with a second refresh period longer than a first refresh period defined by a specification for the semiconductor device.

The second refresh operation may be a burst refresh operation.

In one embodiment, a method of controlling a semiconductor memory device is disclosed. The semiconductor memory device includes a memory cell array including a plurality of memory cell rows. The method includes: performing a first refresh sub-operation on the memory cell rows based on a first signal toggling at a first period; comparing a reference time period to an active time period of a signal that initiates a refresh operation that includes the first refresh sub-operation; when the active time period is longer than the reference time period, then after performing the first refresh sub-operation, performing a second refresh sub-operation on the memory cell rows based on a second signal toggling at a second period shorter than the first period, and when the active time period is shorter than the reference time period, then after performing the first refresh sub-operation, not performing the second refresh sub-operation on the memory cell rows.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Figure 1:
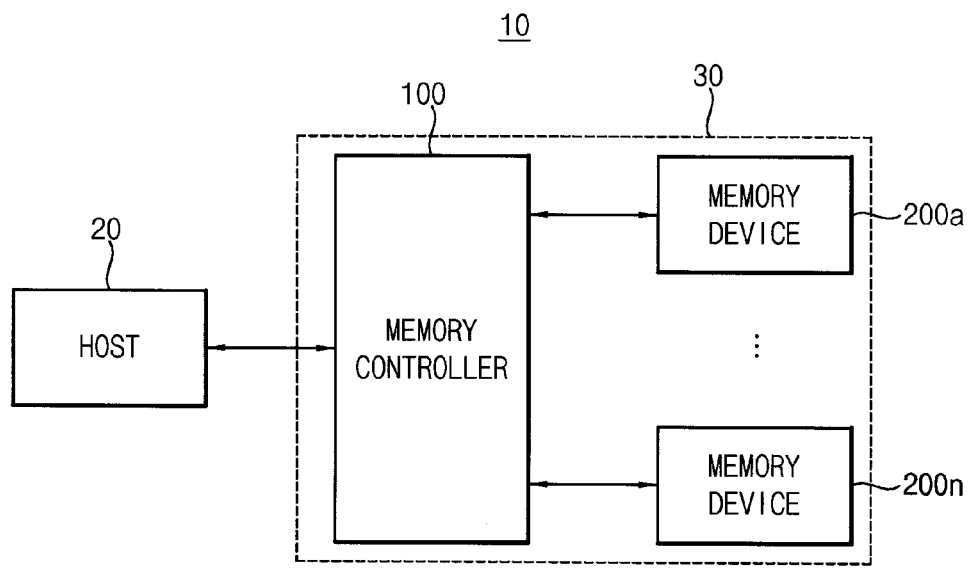
FIG. 1 is a block diagram illustrating an electronic system according to some example embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless the context indicates otherwise, these terms are generally used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to some example embodiments.

Referring to FIG. 1, an electronic system 10 includes a host 20 and a memory system 30. The memory system 30 includes a memory controller 100 and a plurality of memory devices 200a~200n.

The host 20 may communicate with the memory system 30 through an interface protocol such as, for example, Peripheral Component Interconnect-Express (PCI-E), Advanced Technology Attachment (ATA), Serial ATA (SATA), Parallel ATA (PATA), or serial attached SCSI (SAS). In other examples, the host 20 may communicate with the memory system 30 through an interface protocol such as Universal Serial Bus (USB), Multi-Media Card (MMC), Enhanced Small Disk Interface (ESDI), or Integrated Drive Electronics (IDE).

The memory controller 100 controls overall operation of the memory system 30. For example, the memory controller 100 may control data exchange between the host 20 and the memory devices 200a~200n. For example, the memory controller 100 writes data to the memory devices 200a~200n or reads data from the memory devices 200a~200n in response to requests from the host 20.

In addition, the memory controller 100 applies operation commands to the memory devices 200a~200n for controlling the memory devices 200a~200n.

In some embodiments, the each of the memory devices 200a~200n may be a dynamic random access memory (DRAM), such as a double data rate synchronous dynamic random access memory (DDR SDRAM), a low power double data rate synchronous dynamic random access memory (LP-DDR SDRAM), a graphics double data rate synchronous dynamic random access memory (GDDR SDRAM), a Rambus dynamic random access memory (RDRAM), etc., or may be other types of semiconductor memory devices that require a refresh operation.

Figure 2:
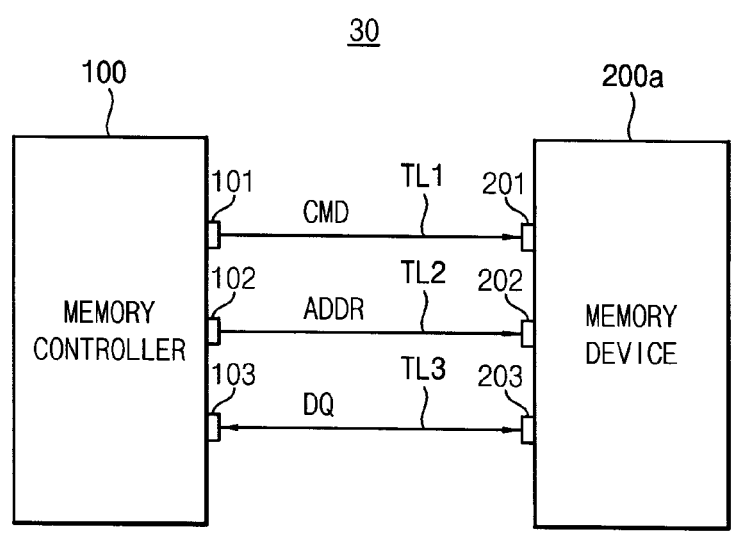
FIG. 2 is a block diagram illustrating an example of the memory system in FIG. 1 according to an embodiment.

FIG. 2 is a block diagram illustrating an example of the memory system in FIG. 1 according to an embodiment.

In FIG. 2, one memory device 200a corresponding to the memory controller 100 is illustrated for convenience.

Referring to FIG. 2, the memory system 30 includes the memory controller 100 and the memory device 200a. The memory controller 100 and the memory device 200a may be connected to each other through corresponding command pins 101 and 201, corresponding address pins 102 and 202 and corresponding data pins 103 and 203. The command pins 101 and 201 transmit a command signal CMD through a command transmission line TL1, the address pins 102 and 202 transmit an address signal ADDR through an address transmission line TL2, and the data pins 103 and 203 exchange data DQ through a data transmission line TL3. Therefore, the command pins 101 and 201, address pins 102 and 202, and data pins 103 and 203, may comprise external connection terminals for the respective memory controller 100 and memory device 200a. Each pin is connected between circuitry of the respective memory controller 100 or memory device 200a, and respective transmission lines TL1-TL3.

Referring to FIGS. 1 and 2, the memory controller 100 may input data to the memory device 200a or may receive data output from the memory device 200a through the data pins 103 and 203 based on the request from the host 20. In addition, the memory controller 100 outputs address to the memory device 200a.

Figure 3:
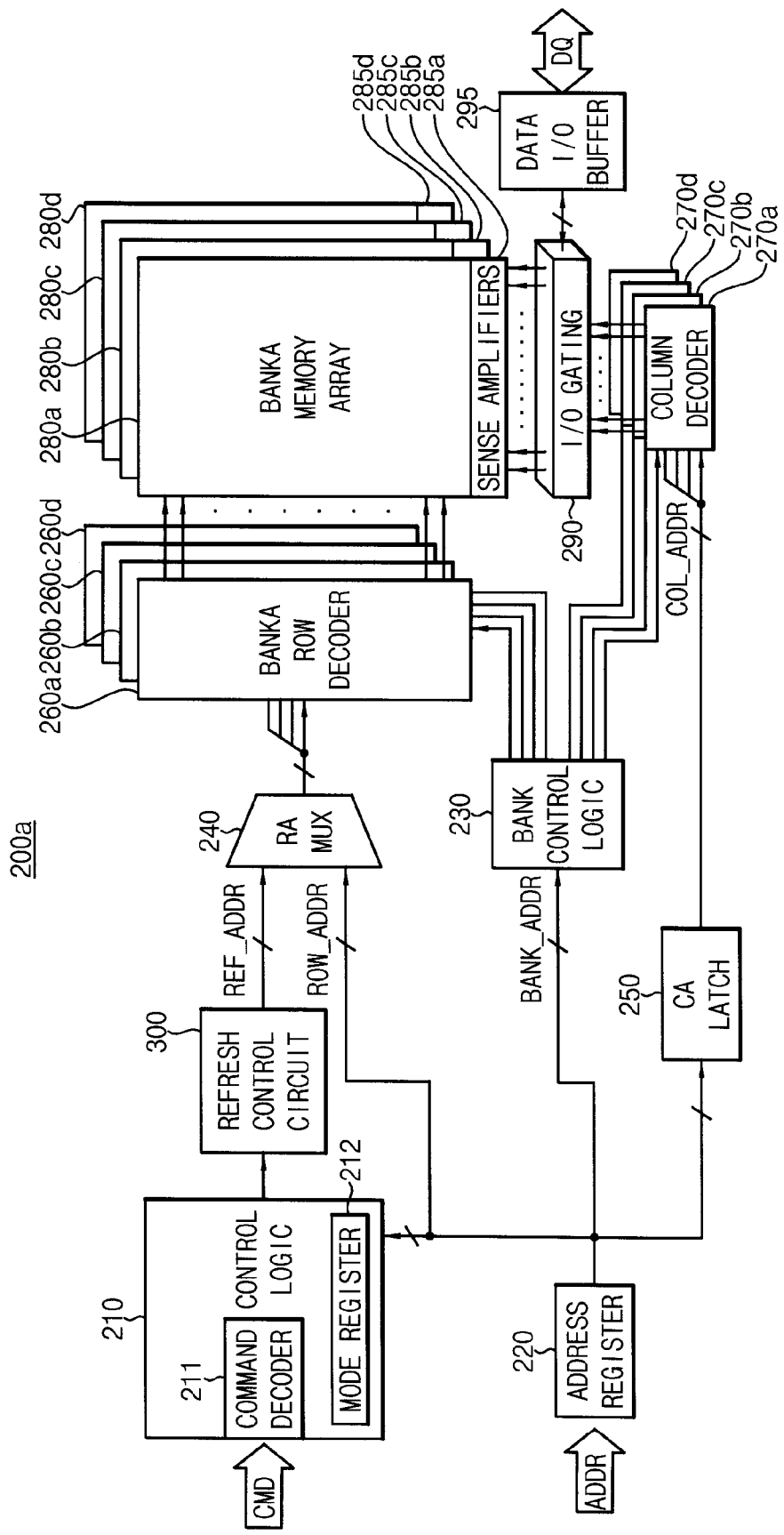
FIG. 3 is a block diagram illustrating an example of the memory device in FIG. 2 according to some example embodiments.

FIG. 3 is a block diagram illustrating an example of the memory device in FIG. 2 according to some example embodiments.

Referring to FIG. 3, the memory device 200a includes a control logic 210, an address register 220, a bank control logic 230, a row address multiplexer 240, a column address latch 250, a row decoder, a column decoder, a memory cell array, a sense amplifier unit, an input/output gating circuit 290, a data input/output buffer 295 and a refresh control circuit 300.

The memory cell array may include a plurality of bank arrays, such as first through fourth bank arrays 280a, 280b, 280c and 280d. The row decoder may include a plurality of bank row decoders, such as first through fourth bank row decoders 260a, 260b, 260c and 260d respectively coupled to the first through fourth bank arrays 280a, 280b, 280c and 280d, the column decoder may include a plurality of bank column decoders, such as first through fourth bank column decoders 270a, 270b, 270c and 270d respectively coupled to the first through fourth bank arrays 280a, 280b, 280c and 280d, and the sense amplifier unit may include a plurality of bank sense amplifiers, such as first through fourth bank sense amplifiers 285a, 285b, 285c and 285d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks Although the semiconductor memory device 200a is illustrated in FIG. 3 as including four banks, the semiconductor memory device 200a may include any number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh address generator 297. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 generates column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The input/output gating circuit 290 may include a circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295. Data DQ to be written to one bank array of the first through fourth bank arrays 280a, 280b, 280c and 280d may be provide from the memory controller to the data input/output buffer 295. The data DQ provided to the data input/output buffer 295 may be written to the one array bank via write drivers.

The control logic 210 controls operations of the semiconductor memory device 200a. For example, the control logic 210 may generate control signals for the semiconductor memory device 200a to perform a write operation or a read operation. The control logic 210 may include a command decoder 211 that decodes a command CMD received from the memory controller 100 and a mode register 212 that sets an operation mode of the semiconductor memory device 200a. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the semiconductor memory device 200 in a synchronous manner. In addition, the control logic 210 may control the refresh control circuit 300 to selectively perform a second burst refresh operation after performing a self-refresh operation in response to a refresh command.

The refresh control circuit 300 may generate a refresh row address REF_ADDR to be provided to the row address multiplexer under the control of the control logic 210. In addition, the refresh control circuit 300 may selectively perform a second burst refresh operation on a plurality of memory cell rows included in the first through fourth bank arrays 280a, 280b, 280c and 280d after exit from the self refresh operation, based on a comparison of an entering time for the self refresh operation of the memory cell rows and a reference time. In one embodiment, the entering time corresponds to the amount of time that a signal that initiates a self-refresh operation remains in an active state at the beginning of the self-refresh operation. Therefore, the entering time may also be referred to herein as a self-refresh operation initiation signal active time.

Figure 4:
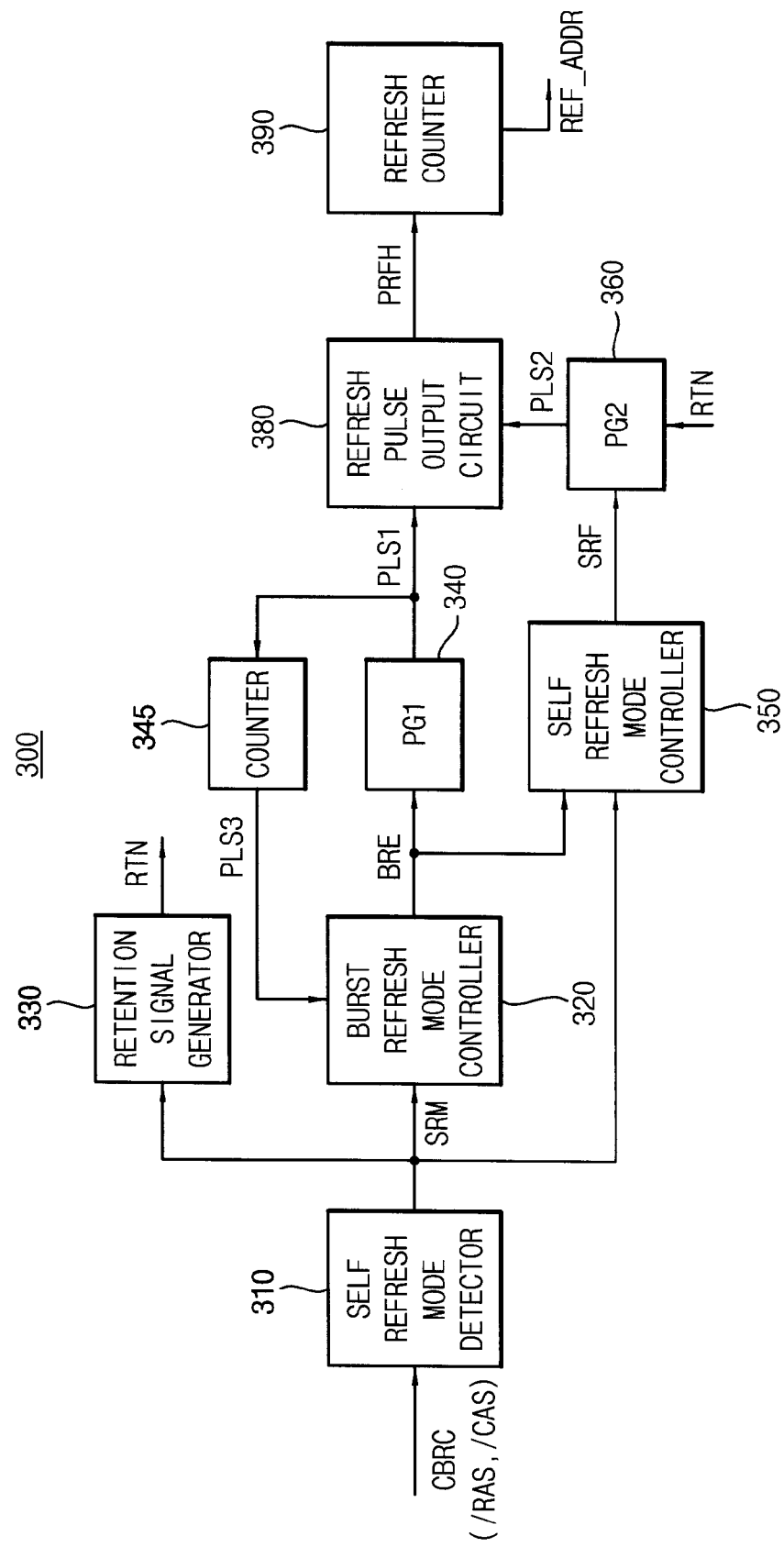
FIG. 4 is a block diagram illustrating an example of the refresh control circuit in FIG. 3 according to some example embodiments.

FIG. 4 is a block diagram illustrating an example of the refresh control circuit in FIG. 3 according to some example embodiments.

Referring to FIG. 4, the refresh control circuit 300 includes a self-refresh mode detector 310, a burst refresh mode controller 320, a retention signal generator 330, a first pulse generator 340, a counter 345, a self-refresh mode controller 350, a second pulse generator 360, a refresh pulse output unit 380, and a refresh counter 390.

The self-refresh mode detector 310 receives a /CAS before /RAS (CBR) command CBRC based on control signals RAS and CAS applied from the memory controller 100 and generates self-refresh starting signal SRM with the lapse of a predetermined time after going into a CBR mode. The self-refresh starting signal refers to a signal that initiates a self-refresh operation and remains active for a certain period of time for the self-refresh operation. As described further below, the period of time during which the self-refresh starting signal is active (between transitioning to active and transitioning back to inactive) may determine a type of refresh operation that occurs. The burst refresh mode controller 320 detects a trigger point of the self-refresh starting signal SRM, i.e., the rising edge and falling edge of self-refresh starting signal SRM and outputs a burst refresh control signal BRE which is enabled to a logic high level.

The retention signal generator 330 receives the self-refresh starting signal SRM and compares an activation interval of the self-refresh starting signal SRM and a predetermined reference time to generate a retention signal RTN. For example, in one embodiment, when the activation interval of the self-refresh starting signal SRM is equal to or greater than the predetermined reference time, the retention signal generator 330 activates the retention signal RTN, and when the activation interval of the self-refresh starting signal SRM is smaller than the predetermined reference time, the retention signal generator 330 deactivates the retention signal RTN. In one embodiment, the reference time is a minimum time required to perform a burst refresh operation on the memory cell rows.

The first pulse generator 340 generates a first pulse signal PLS1 toggling with a first period. In one embodiment, the first pulse generator 340 generates the first pulse signal PLS1 toggling with a first period during an activation interval of the burst refresh signal BRE. The counter 345 counts toggling of the first pulse signal PLS1 to generate a blocking pulse PLS3 for blocking operation of the burst refresh mode controller 320. For example, the counter 345 may count toggling of the first pulse signal PLS1 to generate the blocking pulse PLS3, which is activated when the counted value of the toggling of the first pulse signal PLS1 reaches a predetermined number of pulse counts. The burst refresh controller 320 is disabled in response to the activated blocking pulse PLS3.

The self-refresh mode controller 350 generates a self-refresh control signal SRF in response to the self-refresh starting signal SRM and the burst refresh signal BRE. For example, in one embodiment, the self-refresh mode controller 350 detects the point of time when the activated burst refresh control signal BRE is disabled at the enable state of the self-refresh starting signal SRM to activate the self-refresh control signal SRF.

As such, the self-refresh mode detector 310 may detect a type of refresh operation for the semiconductor memory device to perform, and the self-refresh mode controller 350 may determine when to initiate a self-refresh mode within the selected type of refresh operation, based on the output from the self-refresh mode detector 310.

The second pulse generator 360 generates a second pulse signal PLS2 toggling with a second period in response to the self-refresh control signal SRF and the retention signal RTN. The second period may be longer than the first period. In addition, the second period of the second pulse signal PLS2 may be altered based on whether the retention signal RTN is activated. In one embodiment, when the retention signal RTN is activated, the second period of the second pulse signal PLS2 may be longer than a self-refresh interval defined by a specification for the memory device. In another embodiment, when the retention signal RTN is activated, the second period of the second pulse signal PLS2 may be the same as the self-refresh interval defined by the specification.

The refresh pulse output circuit 380 receives the first and second pulse signals PLS1 and PLS2 and outputs an activated one of the first and second pulse signals PLS1 and PLS2 as a refresh pulse signal PRFH. That is, the refresh pulse output circuit 380 receives the first and second pulse signals PLS1 and PLS2, determines activated one of the first and second pulse signals PLS1 and PLS2 and outputs activated one as the refresh pulse signal PRFH. The refresh counter 390 generates a refresh row-address that increments/decrements gradually in synchronization with the refresh pulse signal PRFH.

Figure 5:
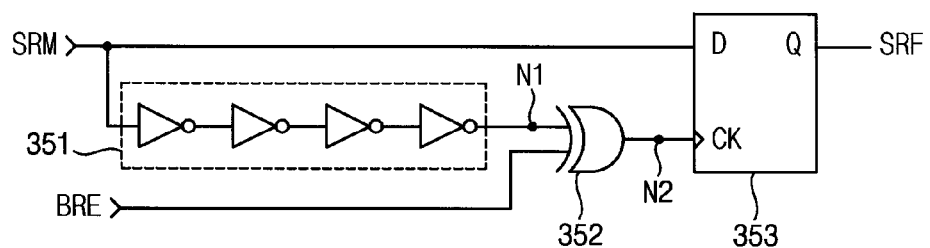
FIG. 5 is a circuit diagram illustrating an example of the self-refresh mode controller in FIG. 4 according to some example embodiments.

FIG. 5 is a circuit diagram illustrating an example of the self-refresh mode controller in FIG. 4 according to some example embodiments.

Referring to FIG. 5, the self-refresh mode controller 350 includes a delay unit 351 having a plurality of inverters, an exclusive OR gate 352 and a D flip-flop 353.

The delay unit 351 may include circuitry, such as the plurality of inverters, that delays the self-refresh starting signal SRM. The exclusive OR gate 353 performs an exclusive OR operation on delayed self-refresh starting signal SRM and the burst refresh signal BRE. The D flip-flop has a clock terminal CK receiving an output of the exclusive OR gate 352, a data terminal D receiving the self-refresh starting signal SRM and an output terminal providing the self-refresh control signal SRF. Therefore, the D flip-flop 353 may synchronize the self-refresh starting signal SRM with a rising edge of the output of the exclusive OR gate 352 to output the self-refresh control signal SRF.

Figure 6:
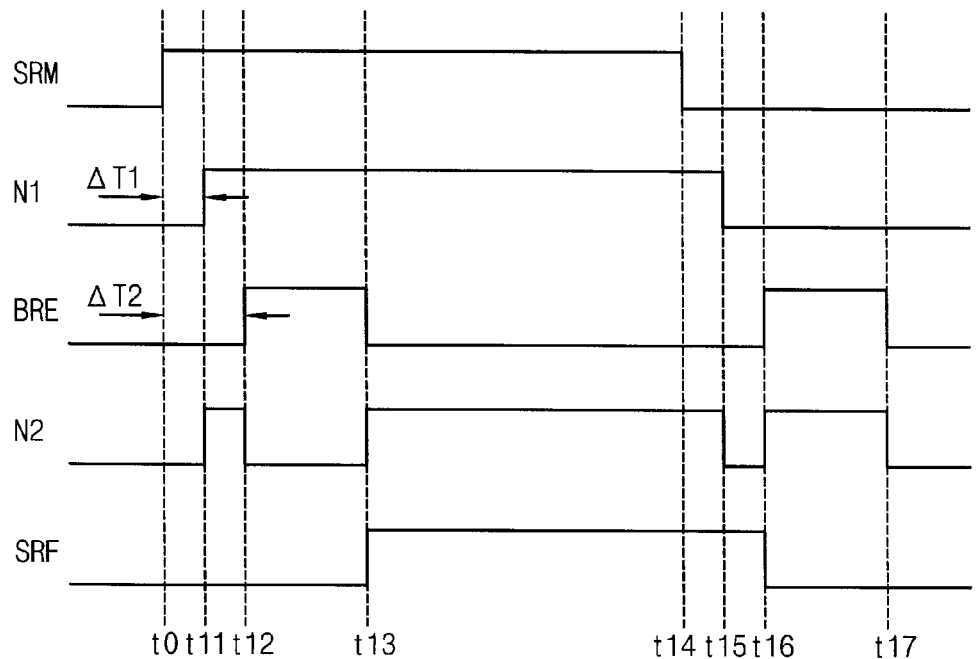
FIG. 6 is timing diagram illustrating an exemplary operation of the self-refresh mode controller in FIG. 5.

FIG. 6 is timing diagram illustrating an exemplary operation of the self-refresh mode controller in FIG. 5.

In FIGS. 5 and 6, output of the delay unit 351 is provided to a node N1, and output of the exclusive OR gate 352 is provided to a node N2.

Referring to FIGS. 5 and 6, at a time t0, the self-refresh starting signal SRM is activated, and the self-refresh starting signal SRM is in activated state until a time t14. Thus, in this time period, a self-refresh operation is initiated. The delay unit 351 delays the self-refresh starting signal SRM by a delay time ΔT1. As such, at the node N1, the output of the delay unit 351 is activated at a time t11 and is in the activated state until a time t15. At a time t12, the burst refresh signal BRE is activated with a delay time ΔT2 with respect to the self-refresh starting signal SRM and transitions to a low level at a time t13. The output of the exclusive OR gate 352 (the node N2) is activated from the time t11 to the time t12, transitions to a low level at the time t12 and transitions to a high level at time t13. The self refresh mode control signal SRF transitions to a high level at time t13 in synchronization with the output of the exclusive OR gate 352.

At a time t14, the self-refresh starting signal SRM transitions to a low level and the burst refresh signal BRE transitions to a high level at a time t16 and transitions to a low level at a time t17. The output N2 of the exclusive OR gate 352 is in a low level from a time t15 to a time t16, transitions to a high level at time t16 and transitions to a low level at time t17. Therefore, the self-refresh control signal SRF transitions to a low level at time t16.

Figure 7:
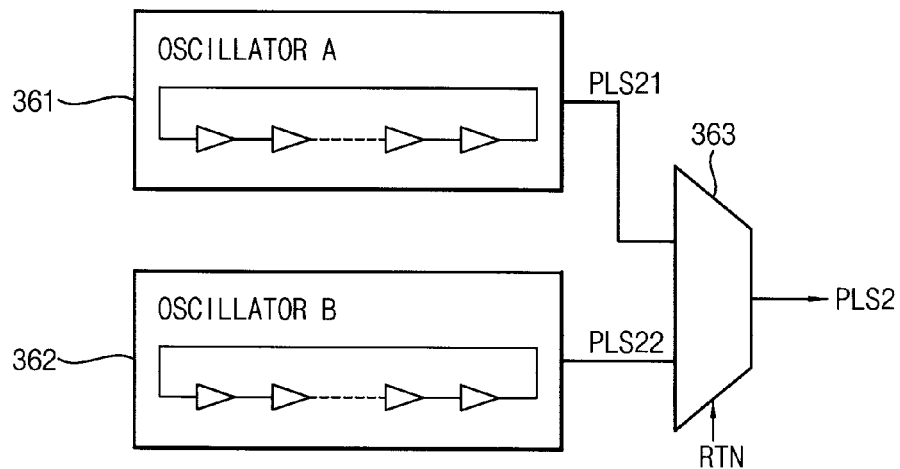
FIG. 7 is a circuit diagram illustrating an example of the second pulse generator in FIG. 5 according to some example embodiments.

FIG. 7 is a circuit diagram illustrating an example of the second pulse generator in FIG. 5 according to some example embodiments.

Referring to FIG. 7, a second pulse generator 360*a* includes a plurality of oscillators 361 and 362 and a multiplexer 363. The oscillators 361 and 362 generate pulse signals PLS21 and PLS22 having different periods. The multiplexer 363 selects one of the pulse signals PLS21 and PLS22 to provide the second pulse signal PLS2 in response to the retention signal RTN. For example, in one embodiment, when the retention signal RTN is activated, the multiplexer 363 selects the pulse signal PLS21 to be outputted as the second pulse signal PLS2, and when the retention signal RTN is deactivated, the multiplexer 363 selects the pulse signal PLS22 to be outputted as the second pulse signal PLS2.

Figure 8:
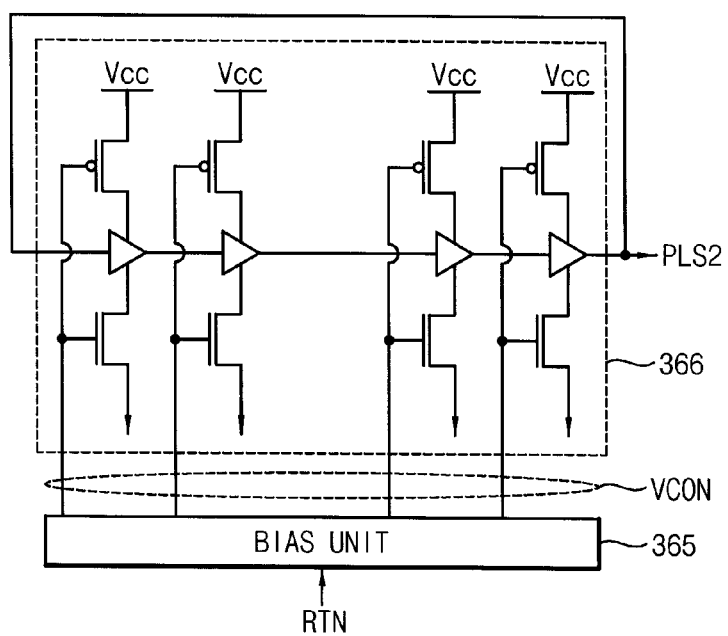
FIG. 8 is a circuit diagram illustrating an example of the second pulse generator in FIG. 5 according to some example embodiments.

FIG. 8 is a circuit diagram illustrating an example of the second pulse generator in FIG. 5 according to some example embodiments.

Referring to FIG. 8, a second pulse generator 360*b* includes bias unit 365 and an oscillator 366. The bias unit 365 generates a control voltage VCON in response to the retention signal RTN. The oscillator 366 generates the second pulse signal PLS2 having a variable period, according to the control voltage VCON.

Figure 9:
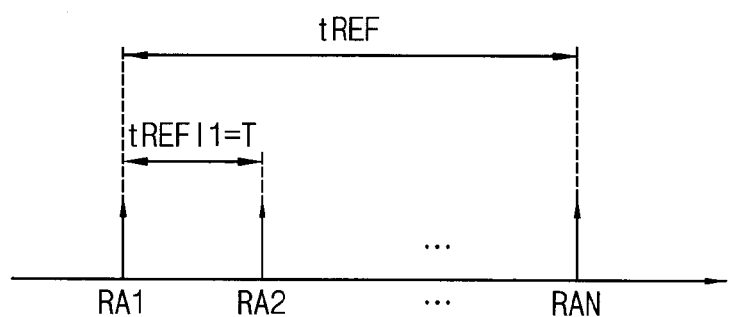
FIG. 9 illustrates general refresh operation in the semiconductor memory device of FIG. 3.
Figure 10:
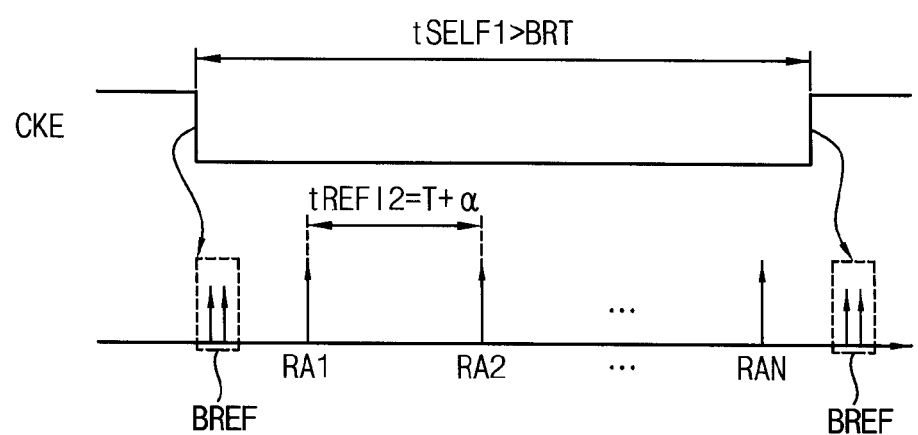
FIGS. 10 and 11 illustrate refresh operation according to some example embodiments.
Figure 11:
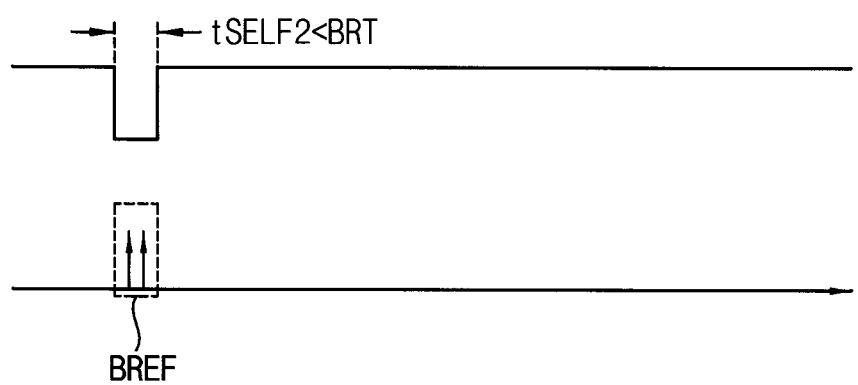

FIG. 9 illustrates a general refresh operation in the semiconductor memory device of FIG. 3, and FIGS. 10 and 11 illustrate refresh operation according to some example embodiments.

Referring to FIG. 9, a refresh interval of the self-refresh operation performed on the memory cell rows RA1~RAN according to the refresh period tREF defined in a specification may be a first refresh interval tREFI1 having a value of T (i.e., a time period having length T).

Referring to FIG. 10, when the entering time tSELF1 for the self-refresh operation according to the clock enable signal CKE is greater than the reference time BRT, a first burst refresh operation BREF is performed on the memory cell rows RA1~RAN right after the self-refresh operation is entered. Right after the first burst refresh operation BREF is completed, the self-refresh mode begins and a self-refresh is performed on the memory cell rows RA1~RAN with a second refresh interval tREFI2 having a value of T+α. In one embodiment, when the entering time tSELF for the self-refresh operation is greater than the reference time BRT, a self-refresh mode includes a self-refresh with a refresh interval longer than a refresh interval defined by the specification, and the self-refresh is performed on the memory cell rows RA1~RAN. When the self-refresh with the second refresh interval tREFI2 is completed on the memory cell rows RA1~RAN, and after the self-refresh operation period tSELF is complete, a second burst refresh operation is performed on the memory cell rows RA1~RAN.

Referring to FIG. 11, when the entering time tSELF2 for the self-refresh operation is smaller than the reference time BRT, a first burst refresh operation BREF is performed on the memory cell rows RA1~RAN right after the self-refresh operation starts. However, a second burst refresh operation is not performed on the memory cell rows RA1~RAN when the self-refresh operation is completed.

As such, the refresh control circuit 300 selectively performs the second burst refresh operation on the plurality of memory cell rows after exit from the self refresh operation, based on a comparison of the entering time for the self refresh operation of the memory cell rows and the reference time.

Figure 12:
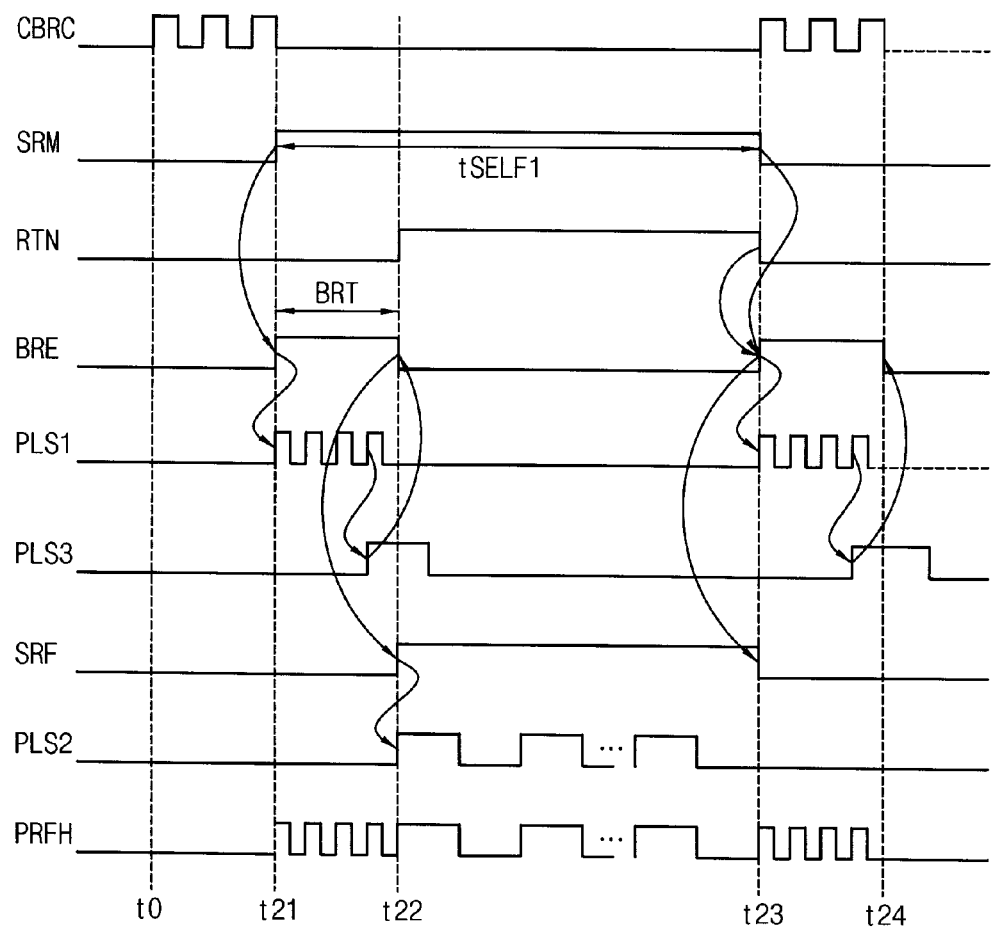
FIGS. 12 and 13 are timing diagrams illustrating operation of the refresh control circuit of FIG. 4 according to some example embodiments.
Figure 13:
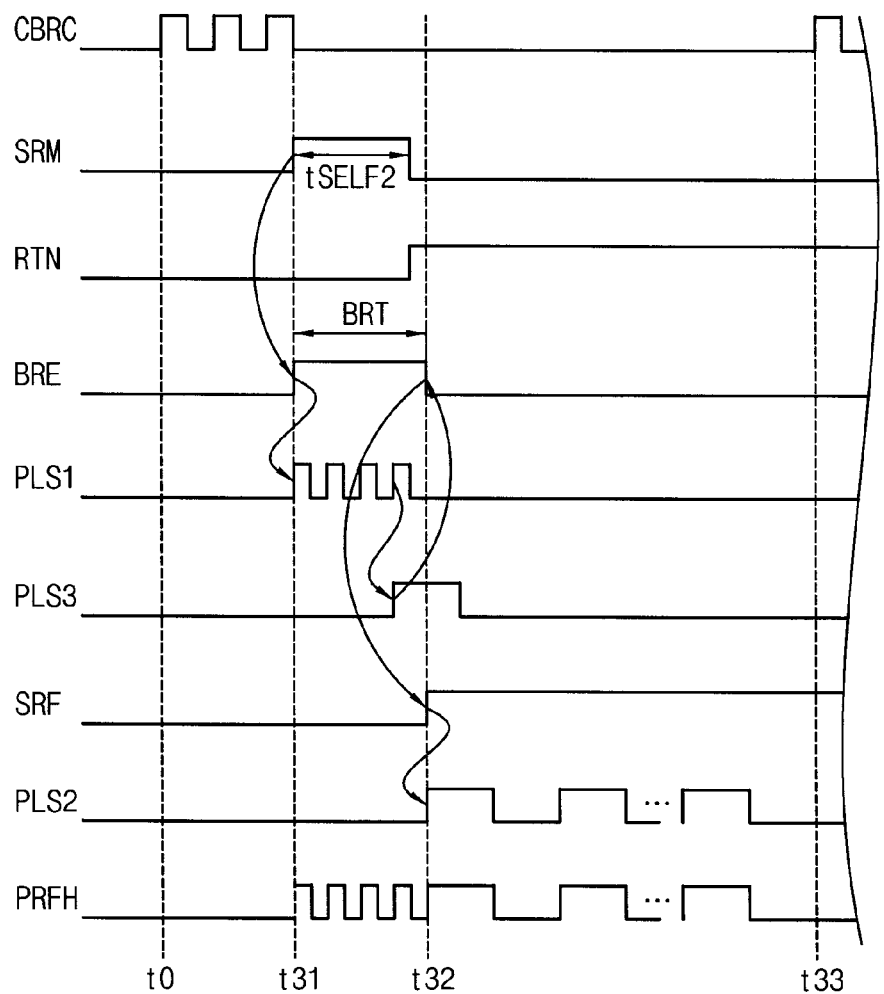

FIGS. 12 and 13 are timing diagrams illustrating operation of the refresh control circuit of FIG. 4 according to some example embodiments.

FIG. 12 illustrates operation of the refresh control circuit 300 of FIG. 4 when the entering time tSELF1 for the self-refresh operation is greater than the reference time BRT, and FIG. 13 illustrates operation of the refresh control circuit 300 of FIG. 4 when the entering time tSELF2 for the self-refresh operation is smaller than the reference time BRT.

Referring to FIGS. 4 and 12, with the lapse of the predetermined time after going into the CBR mode at a time t0, the self-refresh mode detector 310 outputs the self-refresh starting signal SRM which is enabled to the logic high level at a time t21. As the self-refresh starting signal SRM is changed to the logic high level, the burst refresh mode controller 320 is activated, to output the burst refresh control signal BRE of the logic high level at a time t21. As the burst refresh control signal BRE is enabled to the logic high level, the first pulse generator 340 generates the first pulse signal PLS1 toggling with a first period. The refresh pulse output unit 380 outputs the first pulse signal PLS1 toggling with a first period as the refresh pulse signal PRFH during time intervals t21~t22. The refresh counter 390 generates the refresh row address REF_ADDR in response to the refresh pulse signal PRFH, and the first burst refresh operation is performed on the memory cell rows.

The counter 345 counts toggling numbers of the first pulse signal PLS1 to generate the blocking pulse PLS3 that is activated when the counted toggling numbers reach the predetermined toggling value. The burst refresh controller 320 deactivates the burst refresh signal BRE to logic low level in response to the blocking pulse PLS3 at a time t22. The retention signal generator 330 compares the activation interval tSELF1 of the self-refresh starting signal SRM with the reference time BRT and transitions the retention signal RTN at the time t22 to logic high level when the activation interval tSELF1 of the self-refresh starting signal SRM exceeds the reference time BRT.

The self-refresh mode controller 350 detects the point of time when the activated burst refresh control signal BRE is disabled at the enable state of the self-refresh starting signal SRM to activate the self-refresh control signal SRF at a time t22. The second pulse generator 360 generates the second pulse signal PLS2 toggling with a second period in response to the activated self-refresh control signal SRF and the retention signal RTN.

At a time t23, as the self-refresh starting signal SRM is deactivated to the logic low level, the retention signal RTN transitions to a logic low level, and the burst refresh signal BRE transitions to logic high level. The self-refresh mode controller 350 detects activation of the burst refresh signal BRE to deactivate the self-refresh control signal SRF to the logic low level at a time t23. Therefore, the second pulse generator 360 does not generate the second pulse signal PLS2. The refresh pulse output unit 380 outputs the second pulse signal PLS2 toggling with a second period as the refresh pulse signal PRFH during time intervals t22~t23. The refresh counter 390 generates the refresh row address REF_ADDR in response to the refresh pulse signal PRFH, and the self-refresh refresh is performed on the memory cell rows. The second period is longer than the first period and the second period is longer than the self-refresh interval defined by the specification. That is, the self-refresh current IDD6 may be reduced by increasing self-refresh interval.

At a time t23, the burst refresh signal BRE is activated to the logic high level, and the first pulse generator 340 generates the first pulse signal PLS1 toggling with the first period. Therefore, the second burst refresh operation is performed on the memory cell rows right after the self-refresh operation is completed. The burst refresh signal BRE is deactivate to the logic low level at a time t24.

Referring to FIGS. 4 and 13, with the lapse of the predetermined time after going into the CBR mode at a time t0, the self-refresh mode detector 310 outputs the self-refresh starting signal SRM which is enabled to the logic high level at a time t31. As the self-refresh starting signal SRM is changed to the logic high level, the burst refresh mode controller 320 is activated, to output the burst refresh control signal BRE of the logic high level at a time t31. As the burst refresh control signal BRE is enabled to the logic high level, the first pulse generator 340 generates the first pulse signal PLS1 toggling with a first period. The refresh pulse output unit 380 outputs the first pulse signal PLS1 toggling with a first period as the refresh pulse signal PRFH during time intervals t31~432. The refresh counter 390 generates the refresh row address REF_ADDR in response to the refresh pulse signal PRFH, and the first burst refresh operation is performed on the memory cell rows. The self-refresh starting signal SRM is changed to the logic low level before a time t32.

The counter 345 counts toggling numbers of the first pulse signal PLS1 to generate the blocking pulse PLS3 that is activated when the counted toggling numbers reach the predetermined toggling value. The burst refresh controller 320 deactivates the burst refresh signal BRE to logic low level in response to the blocking pulse PLS3 at a time t32. The retention signal generator 330 compares the activation interval tSELF2 of the self-refresh starting signal SRM with the reference time BRT and outputs the retention signal RTN with logic low level because the activation interval tSELF2 is smaller than the reference time BRT. In one embodiment, the reference time BRT has the same value for both examples discussed above in connection with FIGS. 12 and 13.

The self-refresh mode controller 350 detects the point of time when the activated burst refresh control signal BRE is disabled at the disable state of the self-refresh starting signal SRM to activate the self-refresh control signal SRF at a time t32. The second pulse generator 360 generates the second pulse signal PLS2 toggling with a second period in response to the activated self-refresh control signal SRF and the retention signal RTN. At a time t33, since the burst refresh signal BRE is not activated, the first pulse generator 340 does not generate the first pulse signal PLS1 and the second burst refresh operation is not performed on the memory cell rows.

As a result of the examples described above in connection with FIGS. 12 and 13, in one embodiment, for a first self-refresh type operation, when an active time for a signal that initiates a self-refresh operation (e.g., a first self-refresh operation entering time) is above a threshold, a first refresh (also referred to as a first refresh sub-operation, or first refresh operation) occurs (e.g., a burst refresh) after the start of the first self-refresh type operation, the first refresh including a first refresh interval having a first period. Then a second refresh (also referred to as a second refresh sub-operation or second refresh operation) occurs (e.g., a self-refresh) including a second refresh interval having a second period. The second period may be longer than the first period and may also be longer than a standard refresh interval according to a specification for a semiconductor device performing the self-refreshing. Then a third refresh (also referred to as a third refresh sub-operation or third refresh operation) occurs (e.g., another burst refresh) including third refresh interval having a third period. The third period may be the same as the first period. The third refresh may occur immediately following the second refresh.

On the other hand, for a second self-refresh type operation, when an active time for a signal that initiates a self-refresh operation (e.g., a first self-refresh operation entering time) is below a threshold, a first refresh (also referred to as a first refresh sub-operation of first refresh operation) occurs (e.g., a burst refresh) after the start of the first self-refresh type operation, the first refresh including a first refresh interval having a first period. Then a second refresh (also referred to as a second refresh sub-operation or second refresh operation) occurs (e.g., a self-refresh) including a second refresh interval having a second period. The second period may be longer than the first period and may be the same as the standard refresh interval according to the specification for the semiconductor device performing the self-refreshing. Immediately following the second refresh, in one embodiment, no third refresh having a refresh interval having the first period occurs (e.g., no burst refresh follows the second refresh).

As such, based on the active time for a signal that initiates a self-refresh operation, one of two self-refresh operation types, such as those described above, can be selected.

Figure 14:
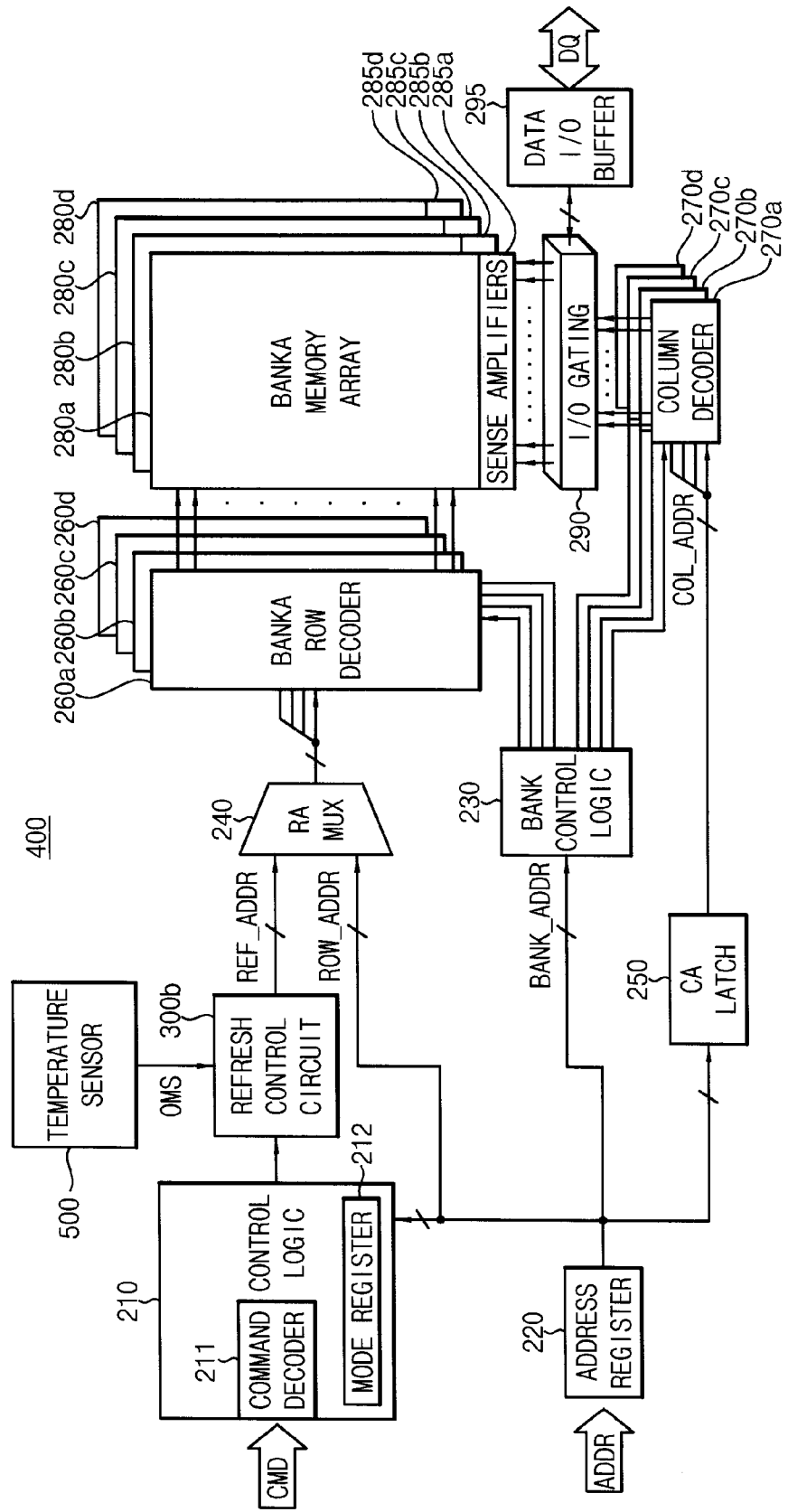
FIG. 14 is a block diagram illustrating an example of the semiconductor memory device according to some example embodiments.

FIG. 14 is a block diagram illustrating an example of a semiconductor memory device according to some example embodiments.

Referring to FIG. 14, the semiconductor memory device 400 includes a control logic 210, an address register 220, a bank control logic 230, a row address multiplexer 240, a column address latch 250, a row decoder, a column decoder, a memory cell array, a sense amplifier unit, an input/output gating circuit 290, a data input/output buffer 295, a temperature sensor 500 and a refresh control circuit 300b.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d, the column decoder may include first through fourth bank column decoders 270a, 270b, 270c and 270d respectively coupled to the first through fourth bank arrays 280a, 280b, 280c and 280d, and the sense amplifier unit may include first through fourth bank sense amplifiers 285a, 285b, 285c and 285d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks Although the semiconductor memory device 400 is illustrated in FIG. 14 as including four banks, the semiconductor memory device 400 may include any number of banks.

When compared with the semiconductor memory device 200a of FIG. 3, the semiconductor memory device 200a further includes the temperature sensor 500 that senses operating temperature of the semiconductor memory device 400 to provide an operation mode signal OMS to the refresh control circuit 300b according to the sensed operating temperature.

The refresh control circuit 300b further receives the operation mode signal OMS and may control refresh operation of the first through fourth bank arrays 280a, 280b, 280c and 280d in further consideration of the operation mode signal OMS.

Figure 15:
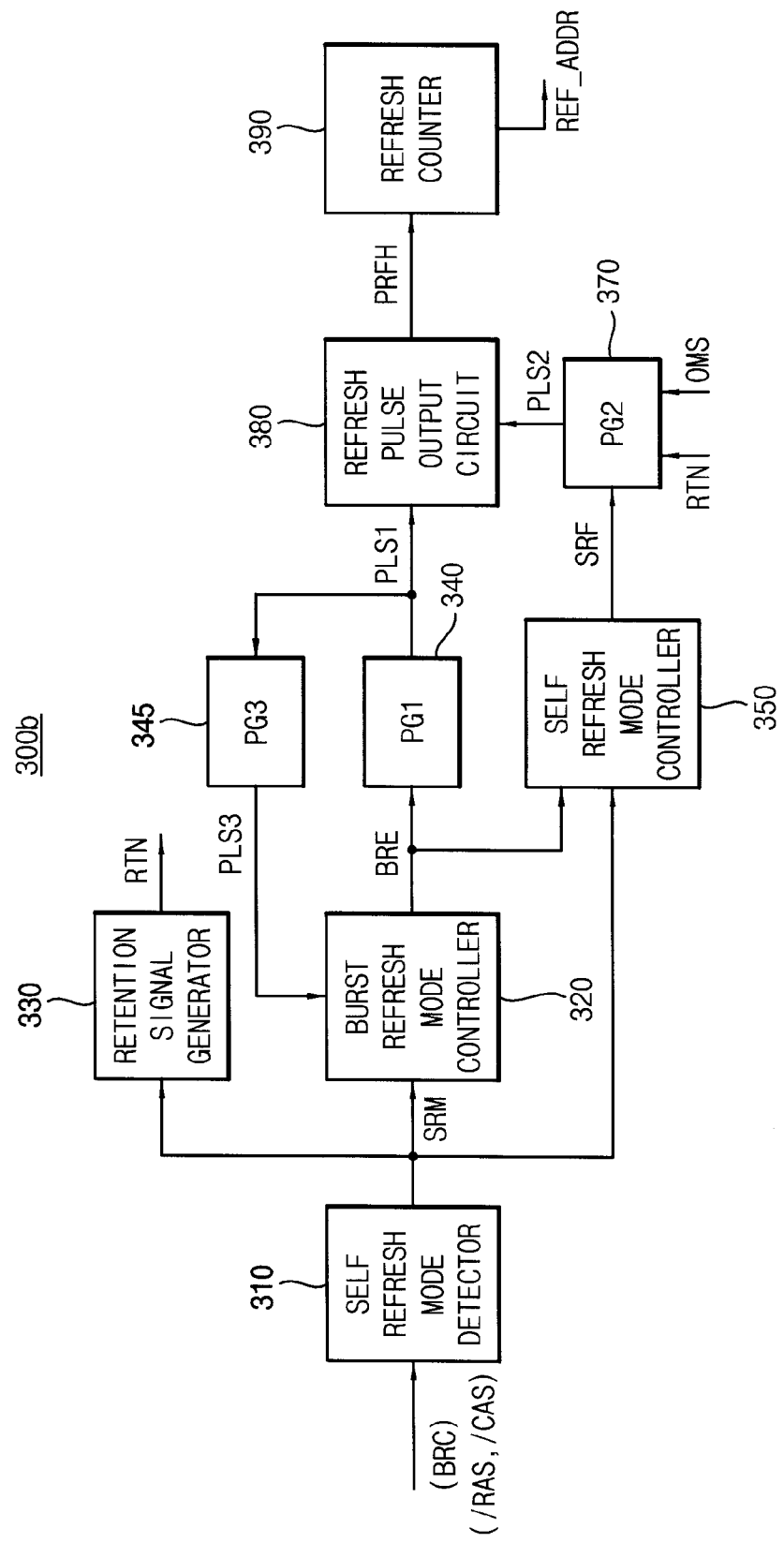
FIG. 15 is a block diagram illustrating an example of the refresh control circuit in FIG. 14 according to some example embodiments.

FIG. 15 is a block diagram illustrating an example of the refresh control circuit in FIG. 14 according to some example embodiments.

Referring to FIG. 15, the refresh control circuit 300b includes a self-refresh mode detector 310, a burst refresh mode controller 320, a retention signal generator 330, a first pulse generator 340, a counter 345, a self-refresh mode controller 350, a second pulse generator 370, a refresh pulse output unit 380, and a refresh counter 390.

The refresh control circuit 15 differs from the refresh control circuit 300 of FIG. 4 in that the second pulse generator 370 further receives the operation mode signal OMS to generate the second pulse signal PLS2. For example, the second pulse generator 370 may alter the second period of the second pulse signal PLS2 by reflecting the operating temperature of the semiconductor memory device 400. For example, the second pulse generator 370 may increase the second period of the second pulse signal PLS2 in a higher operating temperature compared to a lower temperature.

Figure 16:
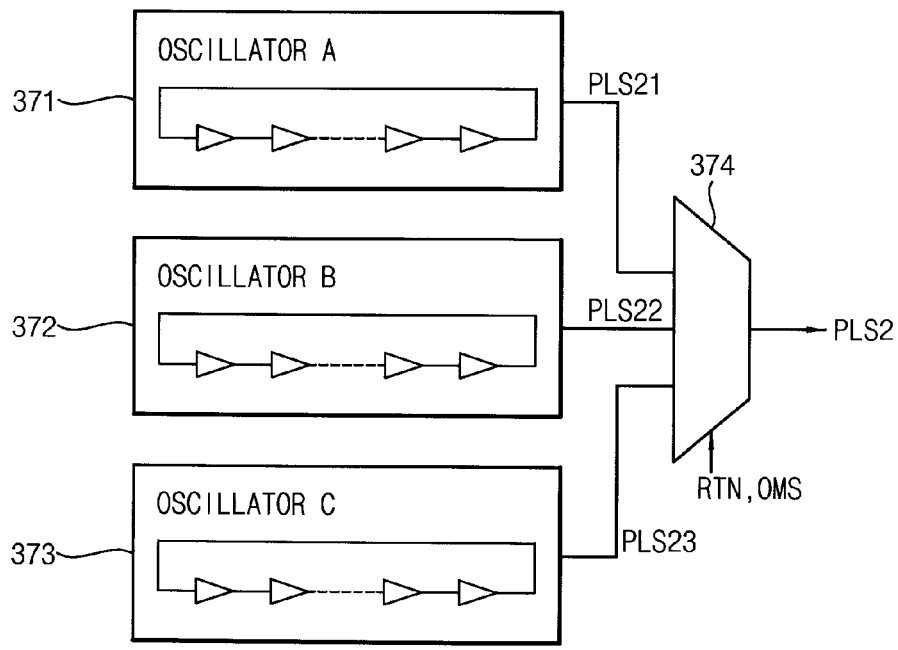
FIG. 16 is a circuit diagram illustrating an example of the second pulse generator in FIG. 15 according to some example embodiments.

FIG. 16 is a circuit diagram illustrating an example of the second pulse generator in FIG. 15 according to some example embodiments.

Referring to FIG. 16, a second pulse generator 370a includes a plurality of oscillators 371, 372 and 373 and a multiplexer 374. The oscillators 371, 372 and 373 generate pulse signals PLS21, PLS22 and PLS23 having different periods. The multiplexer 374 selects one of the pulse signals PLS21, PLS22 and PLS23 to provide the second pulse signal PLS2 in response to the retention signal RTN and the operating mode signal OMS.

Figure 17:
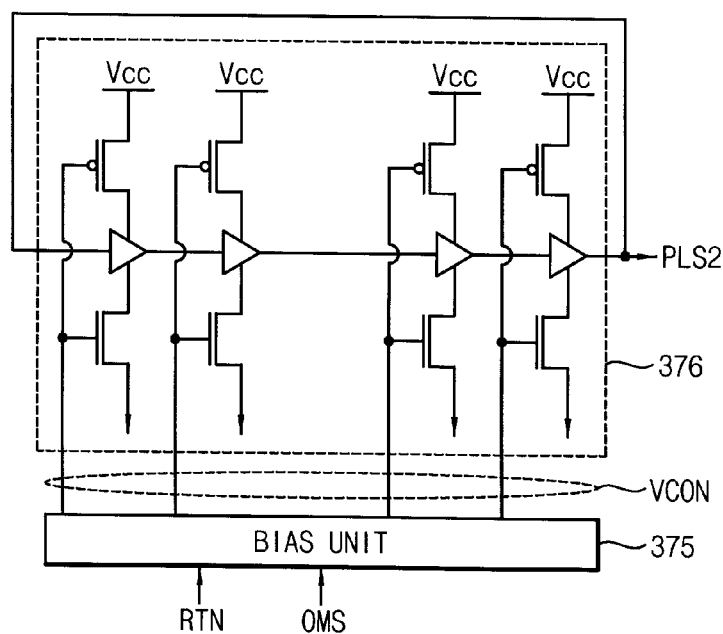
FIG. 17 is a circuit diagram illustrating an example of the second pulse generator in FIG. 15 according to some example embodiments.

FIG. 17 is a circuit diagram illustrating an example of the second pulse generator in FIG. 15 according to some example embodiments.

Referring to FIG. 17, a second pulse generator 370b includes bias unit 375 and an oscillator 376. The bias unit 375 generates a control voltage VCON in response to the retention signal RTN and the operation mode signal OMS. The oscillator 376 generates the second pulse signal PLS2 having a variable period, according to the control voltage VCON.

Figure 18:
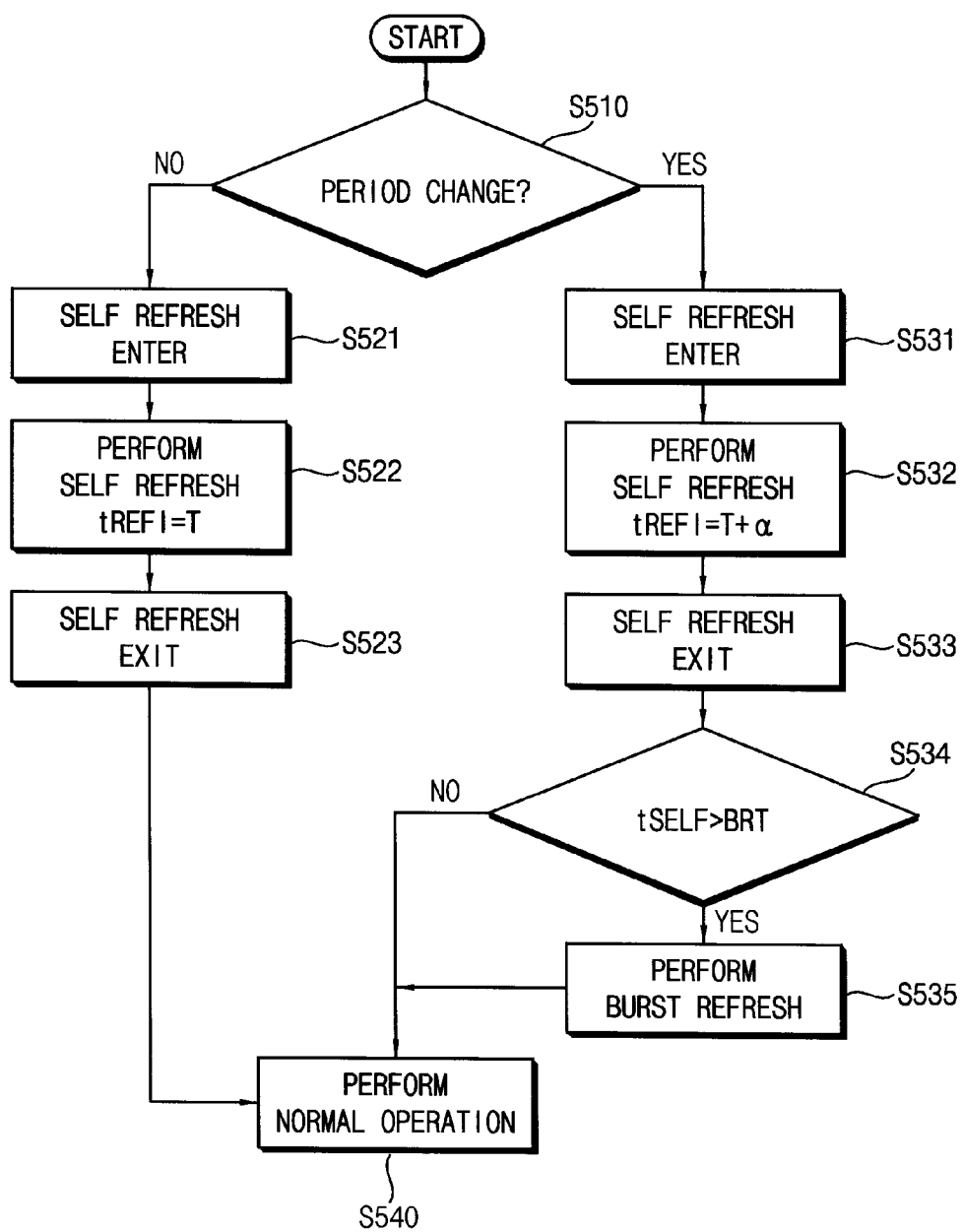
FIG. 18 is a flow chart illustrating a method of a refresh operation of the semiconductor memory device of FIG. 3 according to some example embodiments.

FIG. 18 is a flow chart illustrating a method of refresh operation of the semiconductor memory device of FIG. 3 according to some example embodiments.

Referring to FIG. 18, it is determined whether a refresh period is to be changed (S510). Whether the refresh period is to be changed is determined, for example, by mode register set (MRS) or a self-refresh mode signal or a new command input to an additional data pin of the refresh control circuit 300 of FIG. 4 or the refresh control circuit 300b of FIG. 15. When the refresh period does not need to be changed (NO in S510), the semiconductor memory device 200a enters into the self-refresh mode (S521). Self-refresh operation is performed on the memory cell rows with a self-refresh interval tREFI, for example, defined by a specification for the semiconductor memory device (S522). The semiconductor memory device 200a exits from the self-refresh mode (S523) and normal operation is performed on the memory cell rows (S524).

When the refresh period needs to be changed (YES in S510), the semiconductor memory device 200a enters into the self-refresh mode (S531). A self-refresh operation is performed on the memory cell rows with a self-refresh interval tREFI+α longer than the self-refresh interval defined by the specification (S532). The semiconductor memory device 200a exits from the self-refresh mode (S533) and it is determined whether the entering time tSELF for the self-refresh operation is greater than a reference time, such as a minimum time for the burst refresh operation BRTR to occur (SS534). When the self-refresh operation period tSELF in the self-refresh operation is greater than the reference time BRT (YES in S534), burst refresh operation is performed on the memory cell rows (S535).

In one embodiment, the exit from the self-refresh operation is notified to the memory controller 100 through an additional pin other than the CKE pin. When the memory controller 100 is notified that the semiconductor memory device 200a exits from the self-refresh operation, the memory controller 100 applies a control signal to the semiconductor memory device 200a such that the burst refresh operation with a shorter period is performed on the memory cell rows. In an embodiment, when the semiconductor memory device 200a exits from the self-refresh mode, the semiconductor memory device 200a performs the burst refresh operation with a shorter period by enabling wordlines internally without notifying the memory controller 100. When the entering time tSELF for the self-refresh operation is smaller than the reference time BRT (NO in S534), normal operation is performed on the memory cell rows (S540) without performing a burst refresh.

Figure 19:
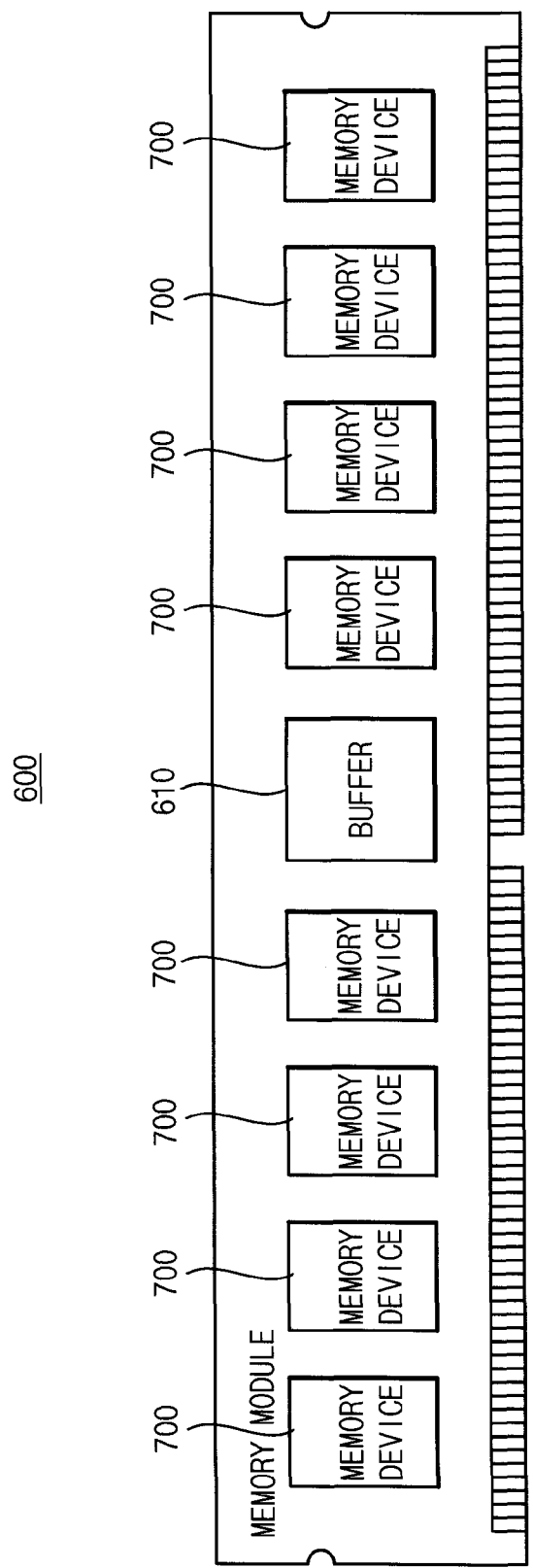
FIG. 19 is a block diagram illustrating a memory module including the semiconductor memory device according to some example embodiments.

FIG. 19 is a block diagram illustrating a memory module including the semiconductor memory device according to some example embodiments.

Referring to FIG. 19, a memory module 600 may include a plurality of semiconductor memory devices 700. In some embodiments, the memory module 600 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 600 may further a buffer 610 that provides a command/address signal and data by buffering the command/address signal and the data from a memory controller through a plurality of transmission lines. In some embodiments, data transmission lines between the buffer 610 and the semiconductor memory devices 700 may be coupled in a point-to-point topology, and command/address transmission lines between the buffer 610 and the semiconductor memory devices 700 may be coupled in a multi-drop topology, a daisy-chain topology, a fly-by daisy-chain topology, or the like. Since the buffer 610 buffers both the command/address signal and the data, the memory controller may interface with the memory module 600 by driving only a load of the buffer 610. Accordingly, the memory module 600 may include more semiconductor memory devices and/or more memory ranks, and a memory system may include more memory modules.

Each of the semiconductor memory devices 700 may employ the semiconductor memory device 200a of FIG. 3 or the semiconductor memory device 400 of FIG. 14. Therefore, each of the semiconductor memory devices 700 may compare a first time, such as the entering time for the self refresh operation of the memory cell rows, to the reference time and performs the second burst refresh operation on the memory cell rows right after exit from the self-refresh operation when the entering time for the self refresh operation exceeds the reference time. In addition, when the entering time for the self refresh operation exceeds the reference time, each of the semiconductor memory devices 700 performs the self-refresh operation with a longer interval than a refresh interval defined by the specification, and thus self-refresh current may be reduced.

Figure 20:
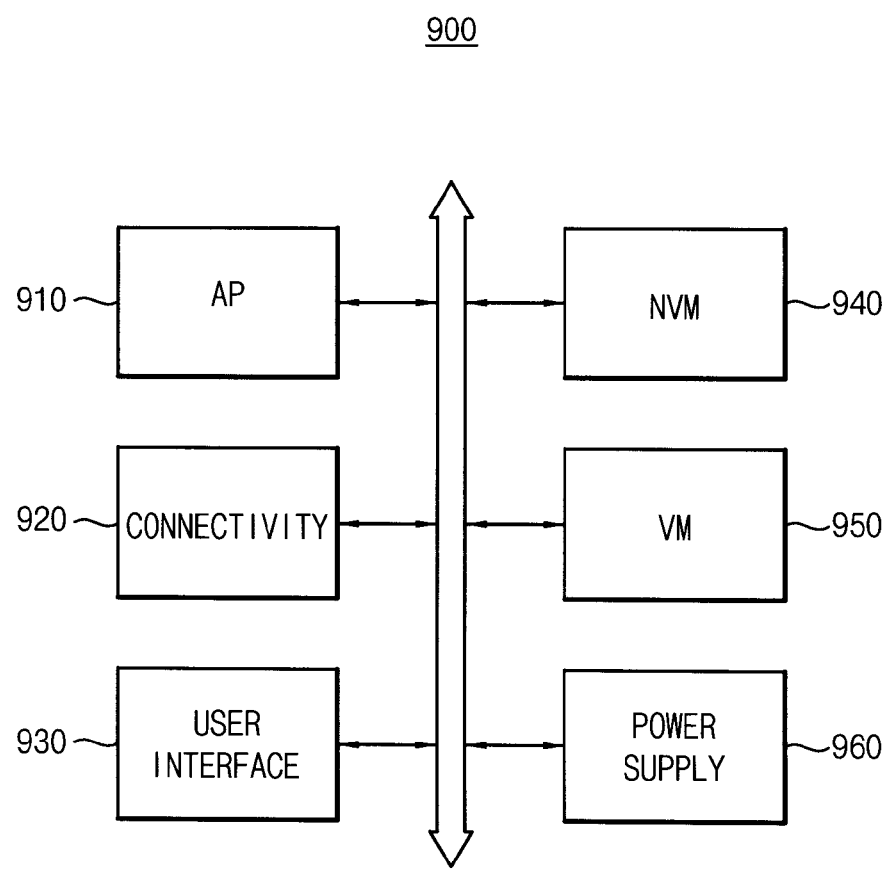
FIG. 20 is a block diagram illustrating a mobile system including the semiconductor memory device according to some example embodiments.

FIG. 20 is a block diagram illustrating a mobile system including the semiconductor memory device according to some example embodiments.

Referring to FIG. 20, a mobile system 900 includes an application processor 910, a connectivity unit 920, a semiconductor memory device 950, a nonvolatile memory device 940, a user interface 930 and a power supply 960. In some embodiments, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 950 may store data processed by the application processor 910, or may operate as a working memory. For example, the semiconductor memory device 950 may be a dynamic random access memory, such as DDR SDRAM, LPDDR SDRAM, GDDR SDRAM, RDRAM, etc., or may be any semiconductor memory device that requires a refresh operation. The semiconductor memory device 950 may employ the semiconductor memory device 200a of FIG. 3 or the semiconductor memory device 400 of FIG. 14. Therefore, the semiconductor memory device 950 compares a first time, such as the entering time for the self refresh operation of the memory cell rows, to the reference time and performs the second burst refresh operation on the memory cell rows right after exit from the self-refresh operation when the entering time for the self refresh operation exceeds the reference time. In addition, when the entering time for the self refresh operation exceeds the reference time, the semiconductor memory device 950 performs the self-refresh operation with a longer interval than a refresh interval defined by the specification, and thus self-refresh current may be reduced.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 21:
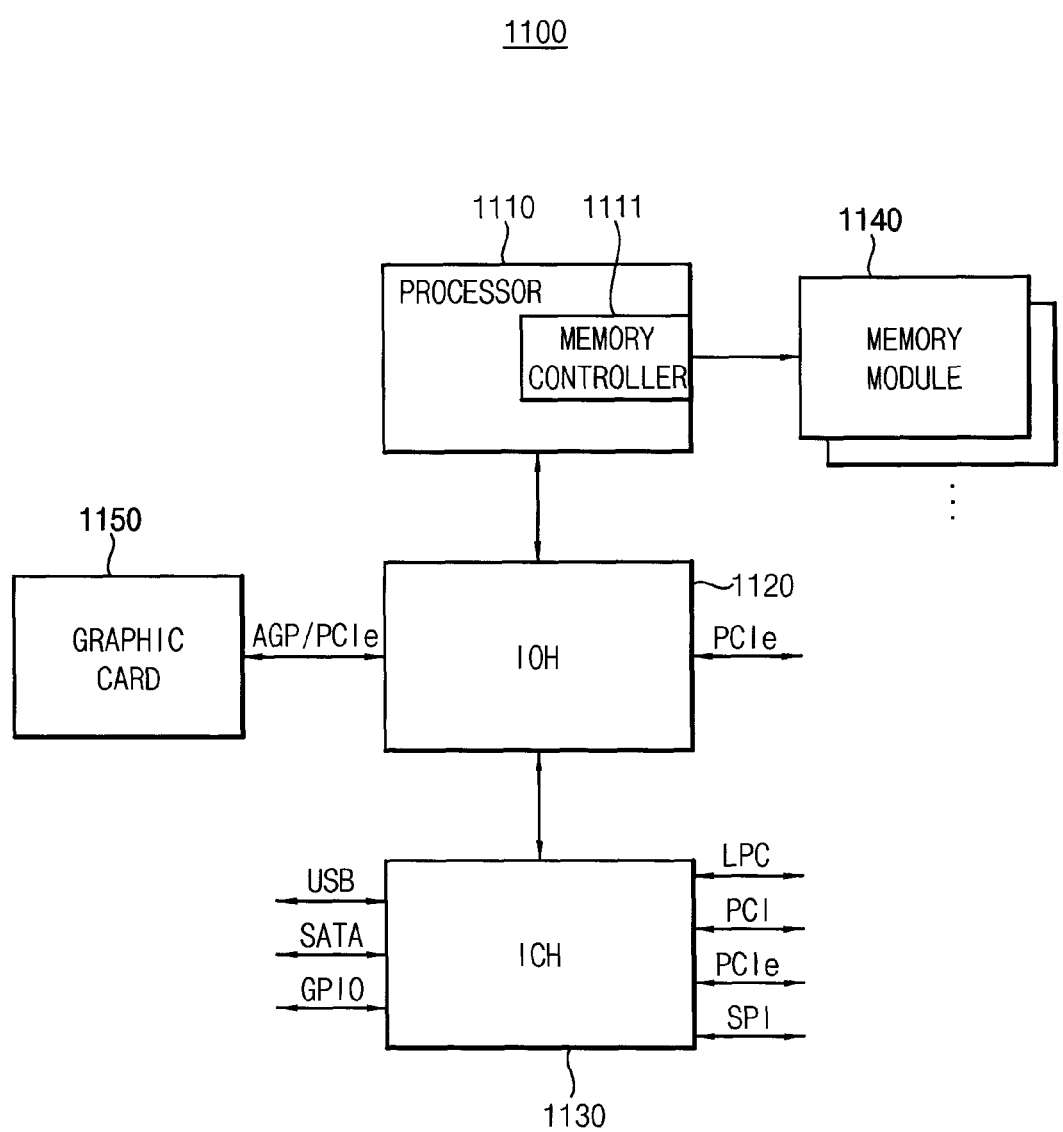
FIG. 21 is a block diagram illustrating a computing system according to some exemplary embodiments.

FIG. 21 is a block diagram illustrating a computing system according to some exemplary embodiments.

Referring to FIG. 21, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 28 illustrates the computing system 1100 including one processor 1110, in some embodiments, the computing system 1100 may include a plurality of processors. The processor 1110 may include an internal or external cache memory.

The memory module 1140 may include a plurality of semiconductor memory devices that store data provided from the memory controller 1111. Each of the may employ the semiconductor memory device 200a of FIG. 3 or the semiconductor memory device 400 of FIG. 14. Therefore, each of the semiconductor memory devices compares a first time, such as the entering time for the self refresh operation of the memory cell rows, to the reference time and performs the second burst refresh operation on the memory cell rows right after exit from the self-refresh operation when the entering time for the self refresh operation exceeds the reference time. In addition, when the entering time for the self refresh operation exceeds the reference time, each of the semiconductor memory devices performs the self-refresh operation with a longer interval than a refresh interval defined by the specification, and thus self-refresh current may be reduced.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a Hyper-Transport, a lightning data transport (LDT), a QuickPath interconnect (QPI), a common system interface (CSI), etc. Although FIG. 40 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal memory device. In some embodiments, the input/output hub 1120 may include an internal graphics device along with or instead of the graphics card 1150 outside the graphics card 1150. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

According to example embodiments, the semiconductor memory device compares a first time, such as the entering time for the self refresh operation of the memory cell rows, to the reference time and performs the second burst refresh operation on the memory cell rows right after exit from the self-refresh operation when the entering time for the self refresh operation exceeds the reference time. In addition, when the entering time for the self refresh operation exceeds the reference time, the semiconductor memory device performs the self-refresh operation with a longer interval than a refresh interval defined by the specification, and thus self-refresh current may be reduced.

The present embodiments concept may be applied to any system including semiconductor memory devices. For example, the present embodiments may be applied to systems such as be a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few exemplary embodiments have been described, those skilled in the art will readily appreciate that many modifications are possible in the exemplary embodi-

What is claimed is:

1. A semiconductor memory device comprising:
a memory cell array including a plurality of memory cell rows; and
a refresh control circuit configured to:
generate a self-refresh starting signal, wherein the self-refresh starting signal is activated when a self-refresh operation of the semiconductor memory device is entered, and is deactivated when the self-refresh operation is exited;
perform a first refresh operation with a first interval on the memory cell rows in response to activating of the self-refresh starting signal;
perform a second refresh operation with a second interval longer than the first interval on the memory cell rows when the first refresh operation is performed;
perform a third refresh operation with the first interval on the memory cell rows in response to deactivating of the self-refresh starting signal when an activation interval of the self-refresh starting signal is longer than a reference time; and
not perform the third refresh operation on the memory cell rows when the activation interval of the self-refresh starting signal is shorter than the reference time.

2. The semiconductor memory device of claim 1, wherein the reference time corresponds to a time required for performing the first refresh operation on the memory cell rows.

3. The semiconductor memory device of claim 1, wherein the refresh control circuit comprises:
a self-refresh mode detector configured to generate the self-refresh starting signal indicating a time at which a self-refresh mode operation initiates, in response to a control signal;
a burst refresh mode controller configured to generate a burst refresh control signal in response to the self-refresh starting signal;
a retention signal generator configured to receive the self-refresh starting signal and configured to compare the activation interval of the self-refresh starting signal and the reference time to generate a retention signal;
a first pulse generator configured to generate a first pulse signal toggling with the first interval, in response to the burst refresh control signal;
a self-refresh mode controller configured to generate a self-refresh control signal in response to the burst refresh control signal and the self-refresh starting signal;
a second pulse generator configured to generate a second pulse signal toggling with the second interval longer than the first interval, in response to the self-refresh control signal and the retention signal; and
a refresh pulse output circuit configured to output one of the first and second pulse signals as a refresh pulse signal.

4. The semiconductor memory device of claim 3, wherein the retention signal generator is configured to activate the retention signal when the activation interval of the self-refresh starting signal is greater than the reference time.

5. The semiconductor memory device of claim 4, wherein the refresh control circuit further includes a counter configured to count toggling of the first pulse signal to generate a blocking pulse that disables the burst refresh mode controller, and the burst refresh control signal is deactivated in response to a rising edge of the blocking pulse.

6. The semiconductor memory device of claim 3, wherein the second pulse generator is configured to increase a period of the second pulse in response to a rising edge of the retention signal.

7. The semiconductor memory device of claim 3, wherein the refresh control circuit further includes a refresh counter configured to generate a refresh row address increasing gradually, in response to the refresh pulse signal.

8. The semiconductor memory device of claim 1, further comprising:
a temperature sensor configured to sense a temperature of the semiconductor memory device during an operation of the semiconductor memory device, and to generate an operation mode signal based on the sensed temperature,
wherein the refresh control circuit is configured to alter the second interval of the second refresh operation in response to the operation mode signal.

9. A semiconductor memory device comprising:
a memory cell array including a plurality of memory cell rows; and
a refresh control circuit configured to cause the semiconductor memory device to:
in response to entering a self-refresh operation, perform a first refresh operation on the memory cell rows based on a first signal toggling at a first period; and
in response to exiting the self-refresh operation, perform a second refresh operation on the memory cell rows based on a second signal toggling at a second period longer than the first period.

10. The semiconductor device of claim 9, wherein the first refresh operation is a burst refresh operation.

11. A method of controlling a semiconductor memory device including a memory cell array including a plurality of memory cell rows, the method comprising:
activating a first signal when a self-refresh operation of the semiconductor memory device is entered, and deactivating the first signal when the self-refresh operation is exited;
after activating the first signal, performing a first refresh sub-operation on the memory cell rows based on a second signal toggling at a first period;
comparing a reference time period to an active time period of the first signal that initiates a refresh operation that includes the first refresh sub-operation;
after deactivating the first signal, performing a second refresh sub-operation on the memory cell rows based on the second signal when the active time period of the first signal is longer than the reference time period; and
after deactivating the first signal, performing a third refresh sub-operation on the memory cell rows based on a third signal toggling at a second period longer than the first period when the active time period of the first signal is shorter than the reference time period.

12. The method of claim 11, further comprising:
sensing a temperature of the semiconductor memory device during an operation of the semiconductor memory device, and generating an operation mode signal based on the sensed temperature; and
changing the second period of the second signal in response to the operation mode signal.

13. The semiconductor memory device of claim 9, further comprising:
a temperature sensor configured to sense a temperature of the semiconductor memory device during an operation of the semiconductor memory device, and to generate an operation mode signal based on the sensed temperature, wherein the refresh control circuit is configured to alter the second period of the second signal in response to the operation mode signal.

* * * * *